(12) United States Patent
Djordjevic et al.

(10) Patent No.: US 8,181,091 B2
(45) Date of Patent: May 15, 2012

(54) HIGH SPEED LDPC DECODING

(75) Inventors: Ivan Djordjevic, Tuscon, AZ (US); Lei Xu, Princeton Junction, NJ (US); Ting Wang, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 227 days.

(21) Appl. No.: 12/571,501

(22) Filed: Oct. 1, 2009

(65) Prior Publication Data

US 2010/0088571 A1 Apr. 8, 2010

Related U.S. Application Data

(60) Provisional application No. 61/102,023, filed on Oct. 2, 2008.

(51) Int. Cl.
*H03M 13/00* (2006.01)

(52) U.S. Cl. .......................... 714/774; 714/776

(58) Field of Classification Search .................. 714/774, 714/776

See application file for complete search history.

(56) References Cited

U.S. PATENT DOCUMENTS

| | | | |
|---|---|---|---|
| 7,975,189 B2 * | 7/2011 | Kose | 714/704 |
| 2004/0240590 A1 * | 12/2004 | Cameron et al. | 375/340 |
| 2005/0193320 A1 * | 9/2005 | Varnica et al. | 714/800 |
| 2006/0195765 A1 * | 8/2006 | Coffey | 714/760 |
| 2007/0286313 A1 * | 12/2007 | Nikopour-Deilami et al. | 375/341 |
| 2009/0271686 A1 * | 10/2009 | Jiang et al. | 714/784 |

* cited by examiner

*Primary Examiner* — M. Mujtaba K Chaudry
(74) *Attorney, Agent, or Firm* — Jeffrey Brosemer; Joseph Kolodka

(57) ABSTRACT

An optical probability-domain LDPC decoder suitable for implementation at 100 Gb/s and above provides large coding gains when based on large-girth LDPC codes. A basic building block, the probabilities multiplier circuit, used to implement both check node and probability node update circuits can be implemented using Mach-Zehnder delay interferometer.

3 Claims, 8 Drawing Sheets

HIGH SPEED LDPC DECODING

CROSS REFERENCE TO RELATED APPLICATION

This application claims the benefit of U.S. Provisional Patent Application No. 61/102,023 filed Oct. 2, 2008.

FIELD OF DISCLOSURE

This disclosure relates to the field of optical communications and in particular to a Low Density Parity Checked (LDPC) decoder and method.

BACKGROUND OF DISCLOSURE

The development of a forward error correction (FEC) scheme suitable for use in 100-Gb/s communications systems and beyond is of considerable interest. Iteratively decodable codes, such as turbo-product codes (TPC) and LDPC codes are promising candidates as they provide improved bit-error ratio (BER) performance. Unfortunately they generally require soft bit reliabilities and consequently are difficult to implement for data rates above 100 Gb/s.

SUMMARY OF DISCLOSURE

An advance is made in the art according to an aspect of the present disclosure wherein an LDPC decoder is implemented in the optical domain by using the integrated optics. In sharp contrast to the prior art, our inventive decoder is implemented in the probabilistic-domain instead of a log-domain. Of further distinction, our inventive structures may advantageously employ a particular probabilistic decoding algorithm that is applicable to arbitrary degree nodes. Finally, to avoid the error floor phenomena which plagued the prior art, we employ large girth ($g \geq 10$) quasi-cyclic LDPC codes, which do not exhibit error floor down to BER of $10^{-15}$.

BRIEF DESCRIPTION OF THE DRAWING

A more complete understanding of the disclosure may be realized by reference to the accompanying drawing in which:

FIGS. 1(b) and 1(c) are graphs illustrating the extrinsic probabilities calculation in: FIG. 1(b) a check node; and FIG. 1(c) a variable node;

DESCRIPTION OF EMBODIMENTS

Figure 1A:
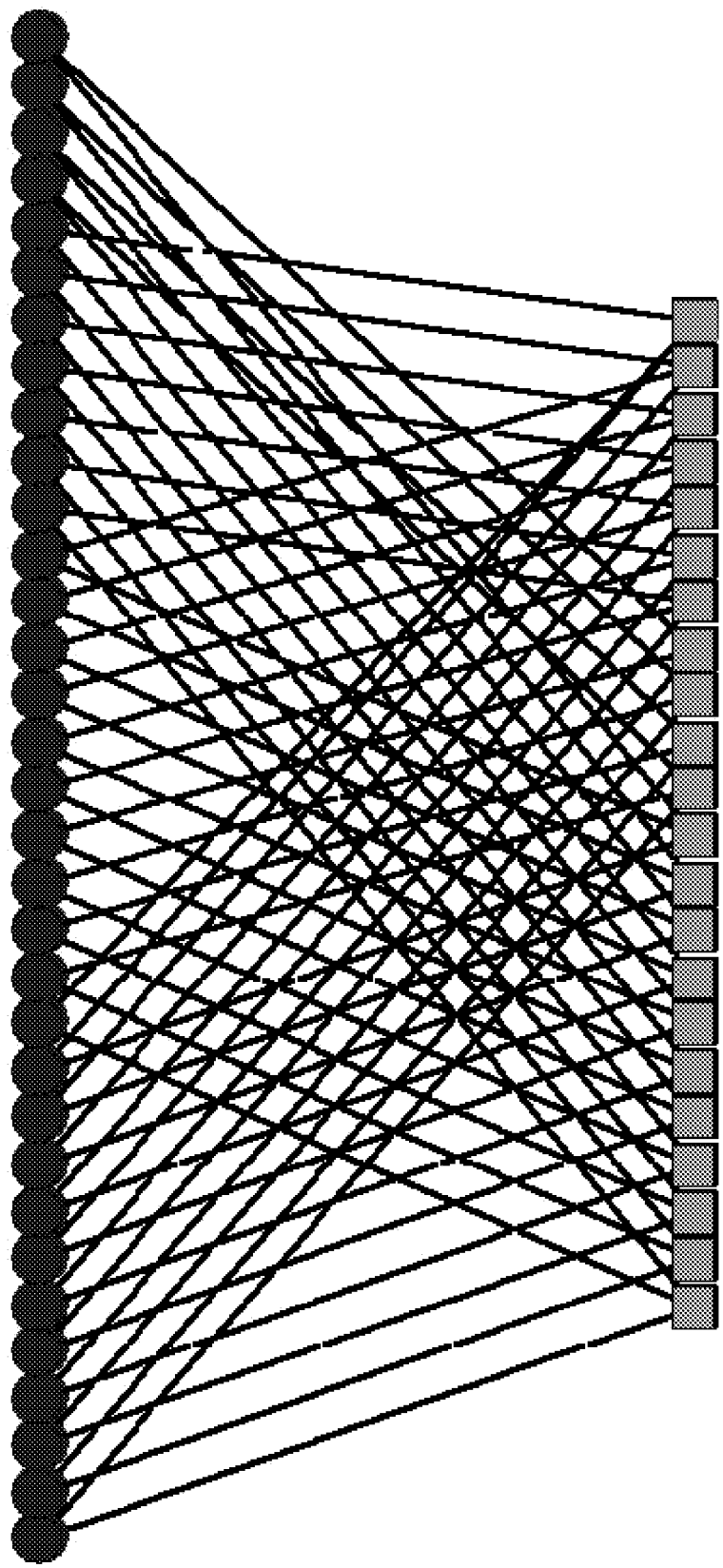
FIG. 1(a) shows an example of bipartite graph of a girth-12 code.

The following merely illustrates the principles of the various embodiments. It will thus be appreciated that those skilled in the art will be able to devise various arrangements which, although not explicitly described or shown herein, embody the principles of the embodiments and are included within their spirit and scope.

Furthermore, all examples and conditional language recited herein are principally intended expressly to be only for pedagogical purposes to aid the reader in understanding the principles of the embodiments and the concepts contributed by the inventor(s) to furthering the art, and are to be construed as being without limitation to such specifically recited examples and conditions.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the diagrams herein represent conceptual views of illustrative structures depicting the principles of the embodiments.

Further understanding of the background and related works may be understood with reference to the following:

[1] Y. Miyata, W. Matsumoto, and T. Mizuochi, "Efficient FEC for optical communications using concatenated codes to combat error-floor," in Proc. OFC/NFOEC 2008, Paper no. OTuE4; [2] T. Mizuochi and Y. Miyata, "LDPC-based advanced FEC for 100 Gbps transmission," in Proc. IEEE LEOS Summer Topicals 2008, pp. 217-218, 21-23 Jul. 2008, Acapulco, Mexico; [3] I. B. Djordjevic, L. L. Minkov, and H. G. Batshon, "Mitigation of linear and nonlinear impairments in high-speed optical networks by using LDPC-coded turbo equalization," IEEE J. Sel. Areas Comm. 26, 73-83 (2008); [4] J. Hagenauer, M. Moerz and A. Schaefer, "Analog decoders and receivers for high speed applications," in Proc. 2002 International Zurich Seminar on Broadband Communications, pp. 3-1-3-6, Feb. 19, 2002-Feb. 21, 2002, Zurich, Switzerland; and [5] R. Nagarajan et al., "Large-scale photonic integrated circuits," IEEE J. Sel. Top. Quantum Electron. 11, 50-64 (2005).

Of all the LDPC approaches described by the above researchers, two prominent ones have emerged. A first one used the generalized LDPC codes with component RS codes. This approach provides excellent coding gains, but it is based on a hard decision decoding, and the resulting decoding latency is high. In another approach, LDPC codes with 2 bits precision are proposed for soft decoding—once 100 Gb/s A/D converters are generally available. Unfortunately this approach also employs a simple decoding algorithm which introduces error floor at a very low BER. To solve that, an additional RS code was used as an outer code.

By way of additional background, it is noted that the sum-product algorithm (SPA) is an iterative LDPC decoding algorithm in which extrinsic probabilities are iterated forward and backward between variable and check nodes of bipartite (Tanner) graph representation of a parity-check matrix.

FIG. 1(a) shows an example of bipartite graph of a girth-12 code. As can be appreciated by those skilled in the art, the girth of the graph represents the shortest cycle in the bipartite graph representation of a parity-check matrix.

Figure 1C:
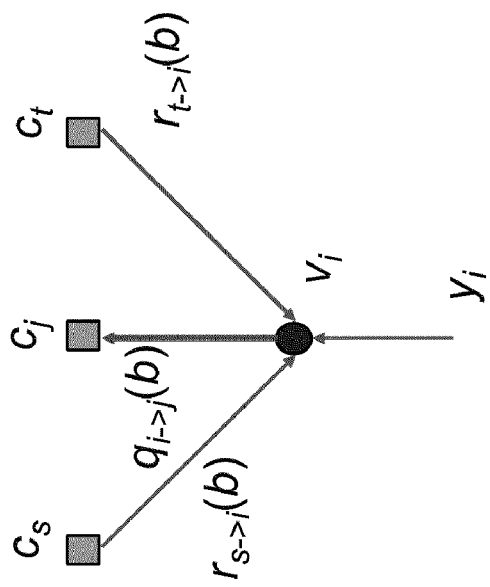
Figure 1B:
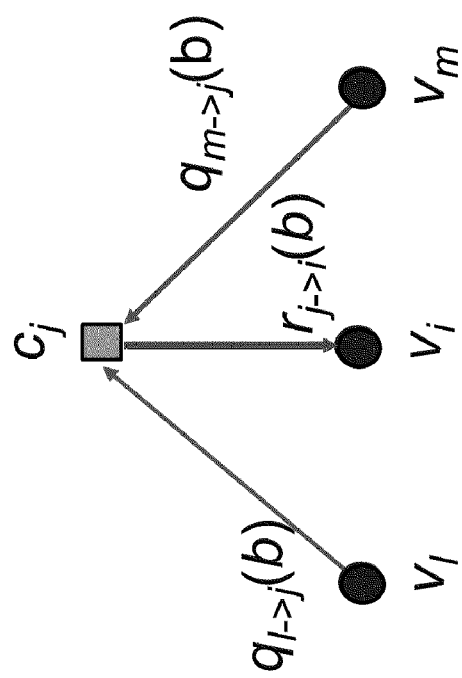

FIGS. 1(b) and 1(c) illustrate the process of creating extrinsic probabilities in variable and check node processors respectively. As shown therein, circles denote the variable nodes involved in $c_j$ parity-check equation (jth row in corresponding parity-check matrix with ones indicating the variable nodes involved in that parity-check equation). The information passed from variable node $v_i$ to function node $c_j$ regarding the probability that $v_i=b$, $b \in \{0,1\}$ is denoted by $q_{i \to j}(b)$.

Similarly, the extrinsic information passed from check node $c_j$ to variable node $v_i$ is denoted by $r_{j \to i}(b)$ and represents the probability that the that jth parity-check equation is satisfied given $v_i=b$, and other bits connected to the same function node have separable distribution given by $\{q_{i \to j'}\}_{j' \neq j}$. Before the probabilistic sum-product algorithm begins we have to first calculate the bit log-likelihood ratios (LLRs) represented by:

$$L(v_i) = \log\left[\frac{Pr(v_i = 0 \mid y_i)}{Pr(v_i = 1 \mid y_i)}\right];$$
$$i = 1, 2, \ldots, n$$

where $L(v_i)$ denotes LLR of ith bit $v_i$ in code word v of length n, and $y_i$ is corresponding receiver sample. For example, for additive white Gaussian noise (AWGN) channel $L(v_i)=2y_i/\sigma^2$, where $\sigma$ is the standard deviation of AWGN process. As can be appreciated, the LLRs are proportional to the received samples.

With this in mind, the probabilistic SPA can be described by the following steps as follows:

Step 0: Initialization
$q_{i \to j} = P_i = [1 + \exp(L(v_i))]^{-1}$

Step 1: The first half-iteration
$r_{j \to i} = q_{l \to j}(1 - q_{m \to j}) + (1 - q_{l \to j})q_{m \to j}$ Step 2: The second half-iteration
$q_{i \to j} = r_{s \to i} r_{t \to i} / [r_{s \to i} r_{t \to i} + (1 - r_{s \to i})(1 - r_{t \to i})]$ Step 3: Variable-node update
$P_i \leftarrow \dfrac{r_{s \to i} r_{t \to i}}{r_{s \to i} r_{t \to i} + (1 - r_{s \to i})(1 - r_{t \to i})}$,
$P_i \leftarrow \dfrac{P_i r_{j \to i}}{P_i r_{j \to i} + (1 - P_i)(1 - r_{j \to i})}$ Step 4: Decision step
$$\hat{v}_i = \begin{cases} 1, & \log\left(\dfrac{1-P_i}{P_i}\right) < 0 \\ 0, & \log\left(\dfrac{1-P_i}{P_i}\right) \geq 0 \end{cases}$$

Steps 1-3 (above) are repeated until a pre-determined number of iterations has been reached or an estimated code word v satisfies the parity-check equation represented by:

$vH^T = 0$ wherein (H-the parity-check matrix) which may be represented by:

$$H = \begin{bmatrix} I & I & I & \ldots & I \\ I & P^{S[1]} & P^{S[2]} & \ldots & P^{S[c-1]} \\ I & P^{2S[1]} & P^{2S[2]} & \ldots & P^{2S[c-1]} \\ \ldots & \ldots & \ldots & \ldots & \ldots \\ I & P^{(r-1)S[1]} & P^{(r-1)S[2]} & \ldots & P^{(r-1)S[c-1]} \end{bmatrix}, \quad (2)$$

and wherein I is a p×p (p is a prime number) identity matrix, P is p×p permunation matrix ($p_{i,i+1}=p_{p,1}=1$, $i=1, 2, \ldots, p-1$; other elements of P are zeros), while r and c represent the number of rows and columns respectively. As may be appreciated, the set of integers S are to be chosen carefully from the set $\{0, 1, \ldots, p-1\}$ so that the cycles of short length, corresponding Tanner (bipartite) graph representation are avoided. An efficient search may be employed, for example, by selecting p=1123 and S={0,2,5,13,20,37,58,91,135,160, 220,292,354,712,830} an LDPC code of rate 0.8, girth g=10, column weight 3 and length of N=16845 is obtained.

The initialization (Step 0) and decision (Step 4) steps require LLR-to-probability and probability-to-LLR conversions. Advantageously, these conversions may be performed using differential bipolar transistors pair as known in the art.

For a situation in which the variable and check node degrees are larger than three (3), we implement steps one (1) and two (2) similarly to that implementation of step three (3). As such, we do not need to modify the bipartite graph by introducing the hidden states so that all check and variable nodes are of degree three (3).

Notice also that in way we performed initialization in step 0), only probabilities $r_{j \to i}$ and $q_{i \to j}$ are memorized in steps one (1) and two (2) while in standard SPA four probabilities are required namely: $r_{j \to i}(0)$; $r_{j \to i}(1)$; $q_{i \to j}(0)$; and $q_{i \to j}(1)$, plus the normalization in steps one (1)-three (3).

Figure 2A:
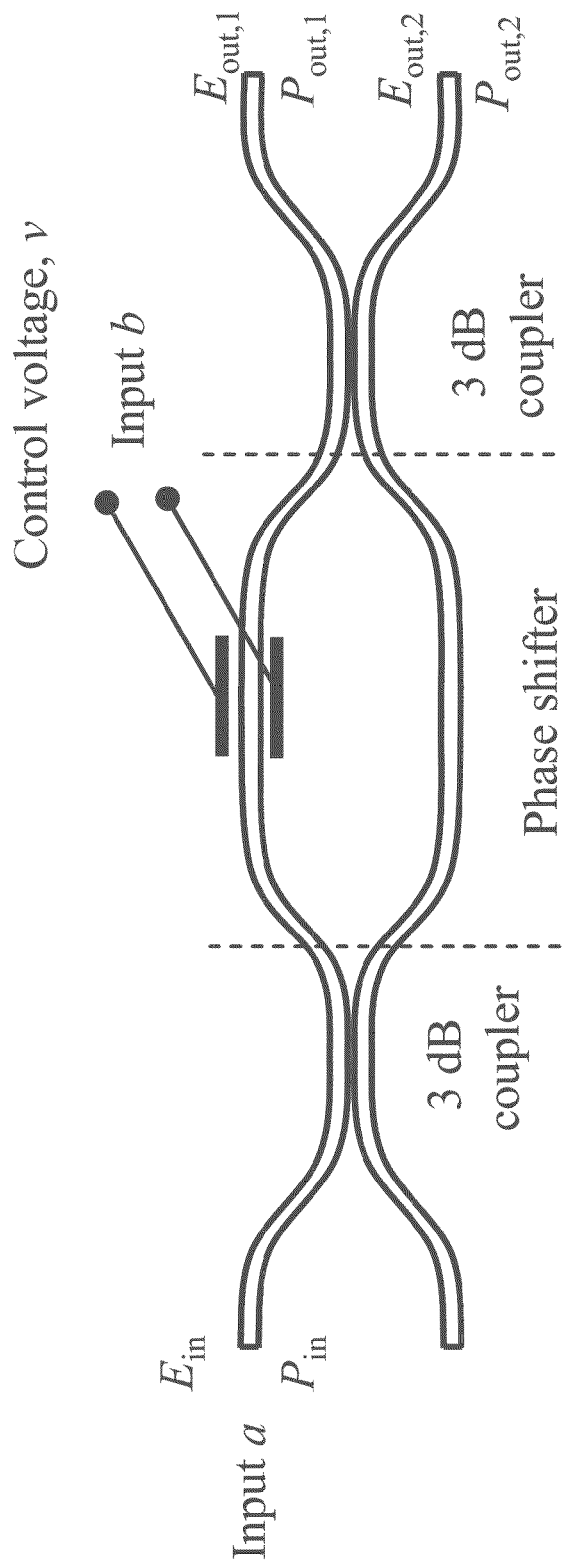
FIG. 2(a) is a schematic of a Mach-Zehnder Interferometer (MZI) probability multiplier.
Figure 2B:
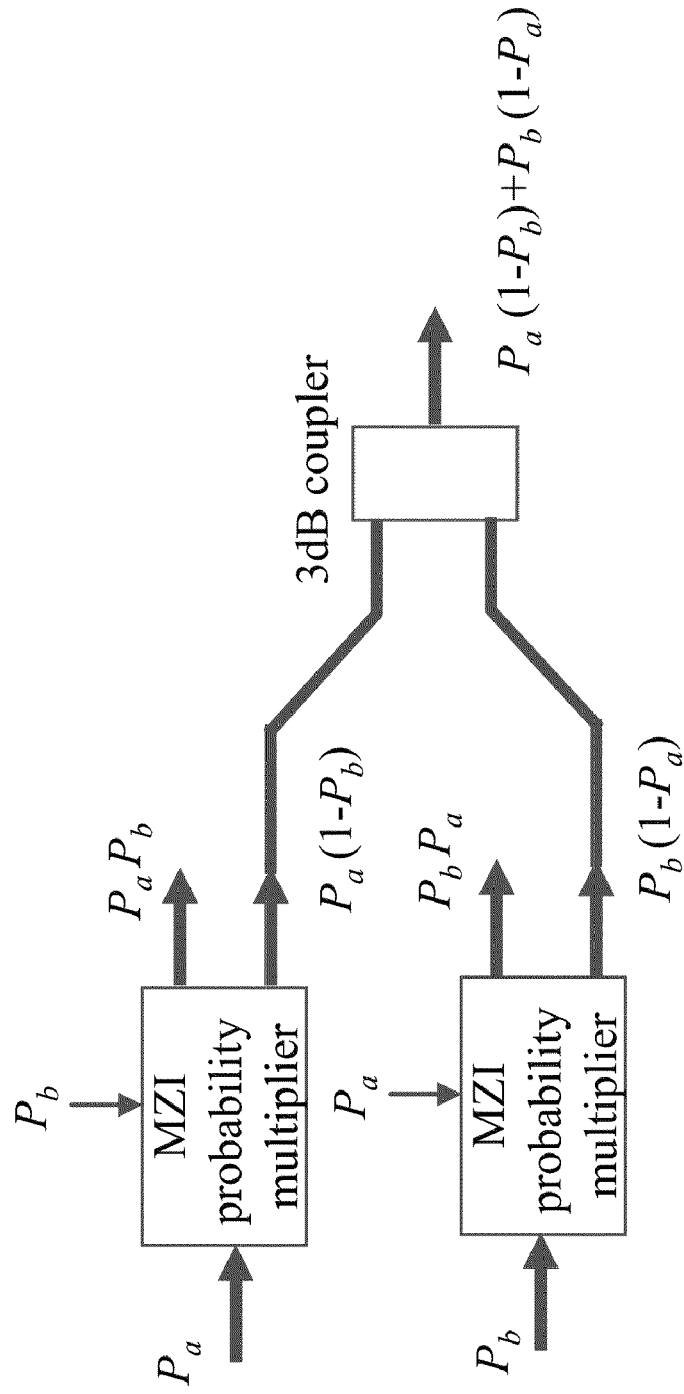
FIG. 2(b) is a schematic of an optical logic circuit according to an aspect of the present disclosure.
Figure 2C:
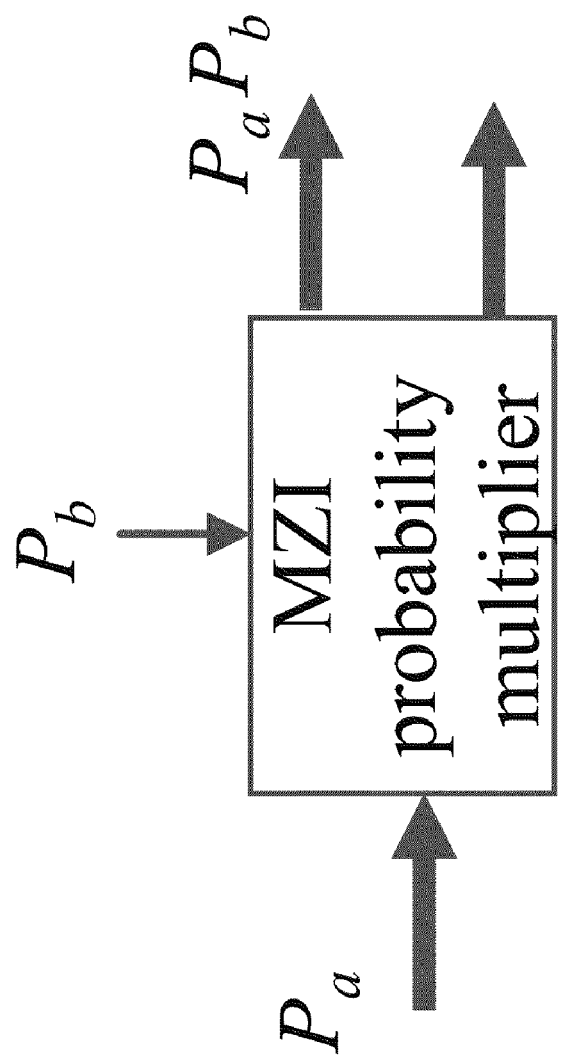
FIG. 2(c) is a schematic of an optical logic circuit according to an aspect of the present disclosure.

Turning now to FIG. 2(b) and FIG. 2(c) there are shown schematics of parity check optical circuit and variable node probability update optical circuit respectively, which are advantageously employed in the method according to the present disclosure. More particularly, steps one (1)-three (3) in the above-outlined method are performed by the optical circuits shown in FIG. 2(b) and FIG. 2(c), respectively. As can be readily appreciated, each may be readily implemented on familiar Mach-Zehnder Interferometer (MZI) multiplier circuit(s) such as that shown schematically in FIG. 2(a).

As those skilled in the art will now readily appreciate, it may be shown using directional coupler theory that electrical fields at output ports $E_{out,1}$ and $E_{out,2}$ are related to input electrical field $E_{in}$ by the relationship:

$E_{out,1} = jE_{in} \sin(\Delta\phi/2), E_{out,2} = jE_{in} \cos(\Delta\phi/2)$, where $\Delta\phi$ is the phase shift introduced by voltage applied across electrodes in the upper branch of the phase shifter.

Similarly, the corresponding output powers may be represented by:

$P_{out,1} = P_{in} \sin^2(\Delta\phi/2), P_{out,2} = P_{in} \cos^2(\Delta\phi/2)$.

Finally, the input power is distributed between output ports as:

$P_{out,1} + P_{out,2} = P_{in}$.

By normalizing the last two equations we obtain:

$P_{out,1}/P_{in} \sin^2(\Delta\phi/2) = p, P_{out,2}/P_{in} = 1-p,$ [1]

and the parameter $0 \leq p \leq 1$ satisfies the axioms of probability.

Figure 2D:
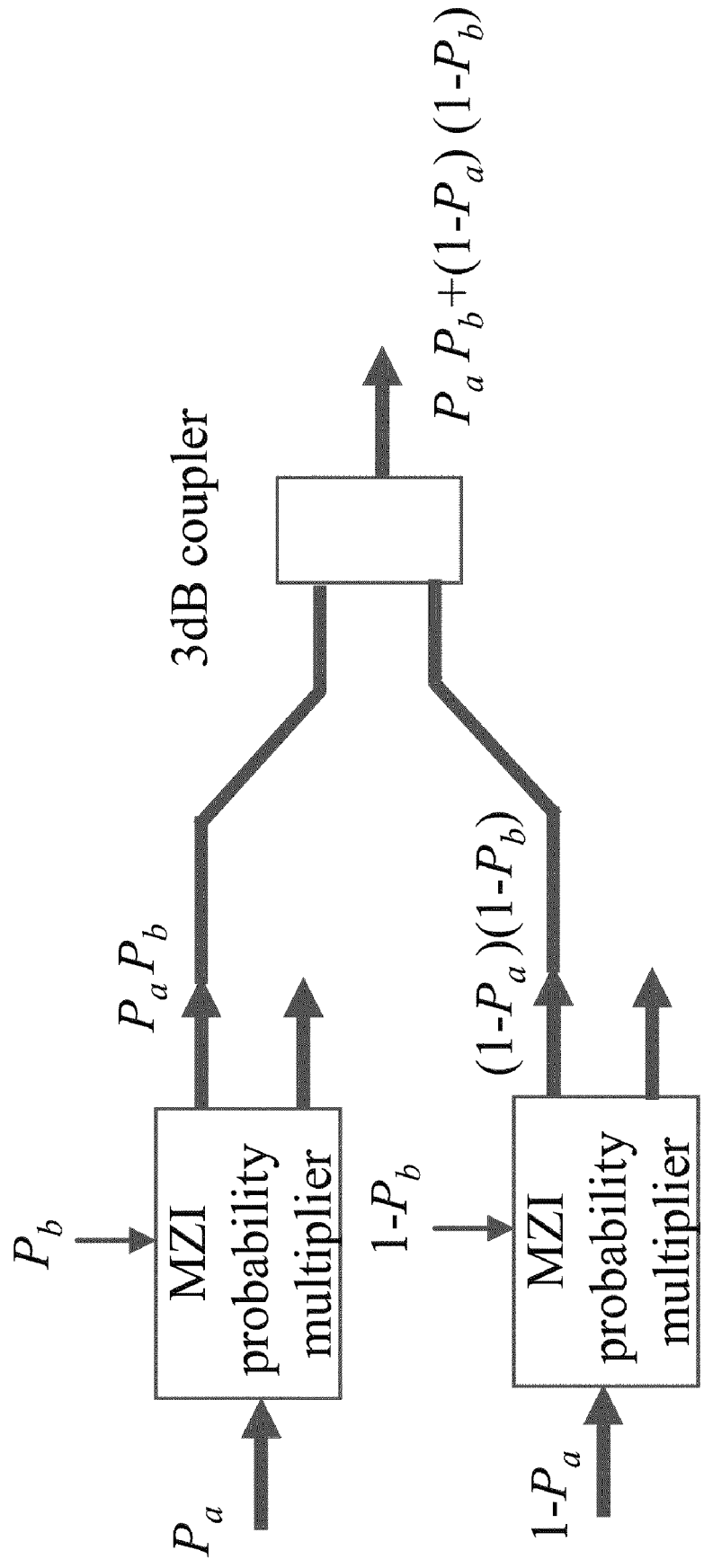
FIG. 2(d) is a schematic of an optical logic circuit according to an aspect of the present disclosure.

If we now let the input power be proportional to probability of signal $P_a$ and the control voltage of phase shifter be proportional to the probability of signal $P_b$, then according to the Eq. [1], the output power of upper branch will be proportional to $P_a P_b$, while the output power of lower branch will be proportional to $P_a(1-P_b)$. Consequently, and as can be readily appreciated, the MZI circuit shown can be used as probabilities multiplier circuit, which is a basic building block to implement steps one (1) through three (3) of our inventive method. Notice that normalization is required in steps two (2)-three (3) requires the use of analog dividers in the electrical domain implementation(s), while optical domain normalization can be performed by using an optical amplifier. This is due to the fact that the following relation holds (see FIG. 2(d)):

$$1/[P_aP_b+(1-P_a)(1-P_b)] \geq 1$$

The implementation of an MZI probability multiplier according to one aspect of the present disclosure (see, FIG. 2(a)) advantageously requires only one optical input (input a) and only one electrical input (input b). A p.i.n. photodetector (for example) may be use to convert from the optical to the electrical domain. Given the recent advances in photonic integrated circuits (PICs) and the state of that art in manufacturing same, an optical implementation of our inventive LDPC decoder is realizable.

Figure 3:
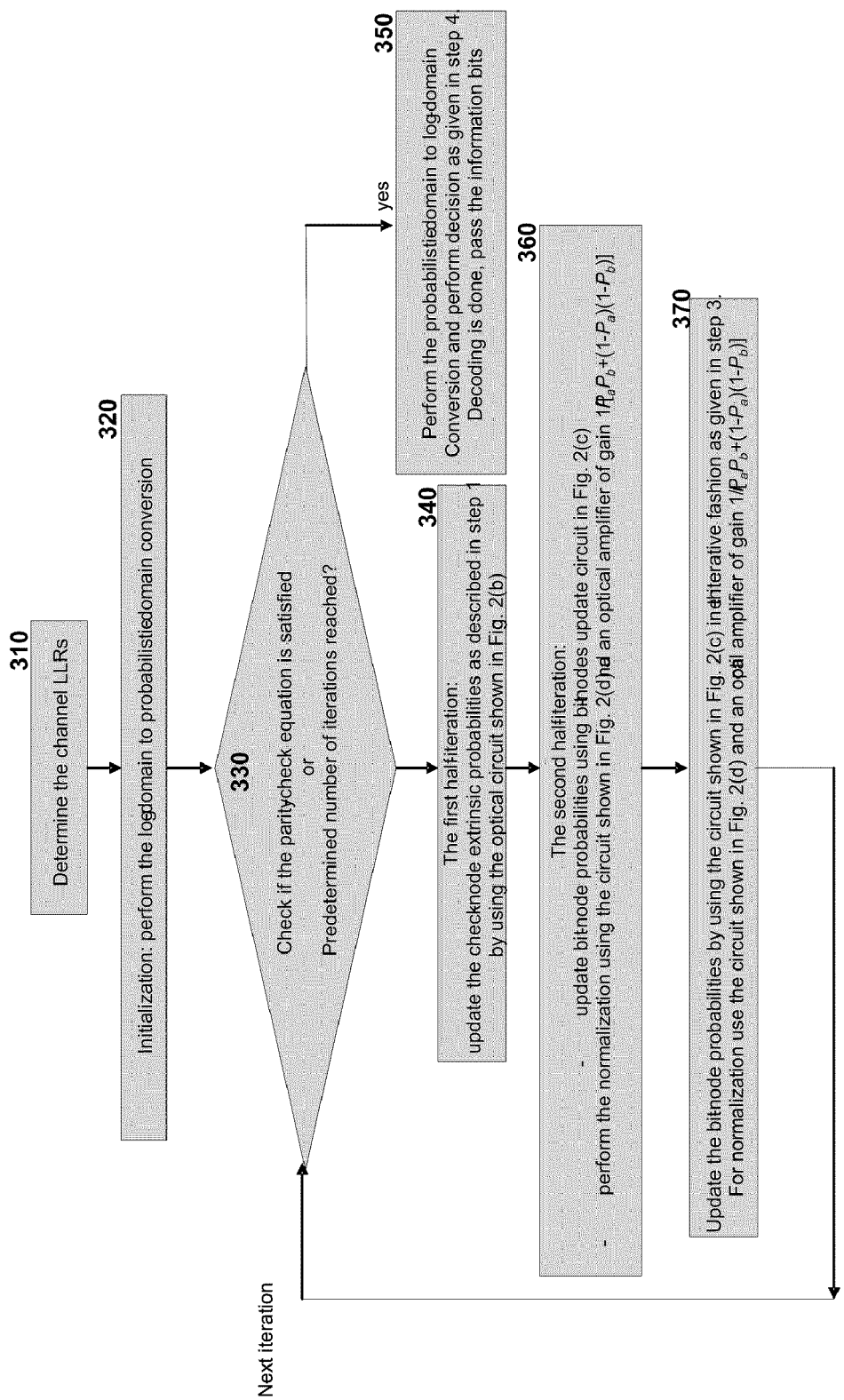
FIG. 3 is a block flow-diagram outlining the method according to an aspect of the present disclosure.

FIG. 3 shows a flow diagram outlining the steps for optical probabilistic-domain decoding of LDPC codes according to an aspect of the present disclosure. More particularly, at block 310 a determination is made of channel log-likelihood ratios (LLRs). Subsequent initialization converts the log-domain to probabilistic-domain at block 320.

Next, a determination is made at block 330 whether a predetermined number of iterations has been performed or whether the parity check equation is satisfied. If either determination is made as affirmative at block 330 then at block 350 a probabilistic-domain to log-domain conversion is performed and a determination is made whether or an estimated code word v satisfies the parity-check equation represented by:

$$vH^T=0$$

wherein (H-the parity-check matrix) which may be represented by:

$$H = \begin{bmatrix} I & I & I & \ldots & I \\ I & P^{S[1]} & P^{S[2]} & \ldots & P^{S[c-1]} \\ I & P^{2S[1]} & P^{2S[2]} & \ldots & P^{2S[c-1]} \\ \ldots & \ldots & \ldots & \ldots & \ldots \\ I & P^{(r-1)S[1]} & P^{(r-1)S[2]} & \ldots & P^{(r-1)S[c-1]} \end{bmatrix} \quad (2)$$

and wherein I is a p×p (p is a prime number) identity matrix, P is p×p permunation matrix ($p_{i,i+1}=p_{p,1}=1$, i=1, 2, ..., p-1; other elements of P are zeros), while r and c represent the number of rows and columns respectively.

If the check performed at block 330 is not true, then the first-half iteration is performed at block 340 which updates the check-node extrinsic probabilities using the optical circuit shown in FIG. 2(b). Next, the second half iteration at block 360 updates bit-node probabilities using bit-nodes update circuit shown in FIG. 2(c) and performs normalization using the circuit shown in FIG. 2(d) and an optical amplifier having a gain of $1/[P_aP_b+(1-P_a)(1-P_b)]$. Finally, at block 370 the bit-node probabilities are updated using the circuit shown in FIG. 2(b), normalization circuit shown in FIG. 2(d) and an optical amplifier having a gain of $1/[P_aP_b+(1-P_a)(1-P_b)]$.

Figure 4:
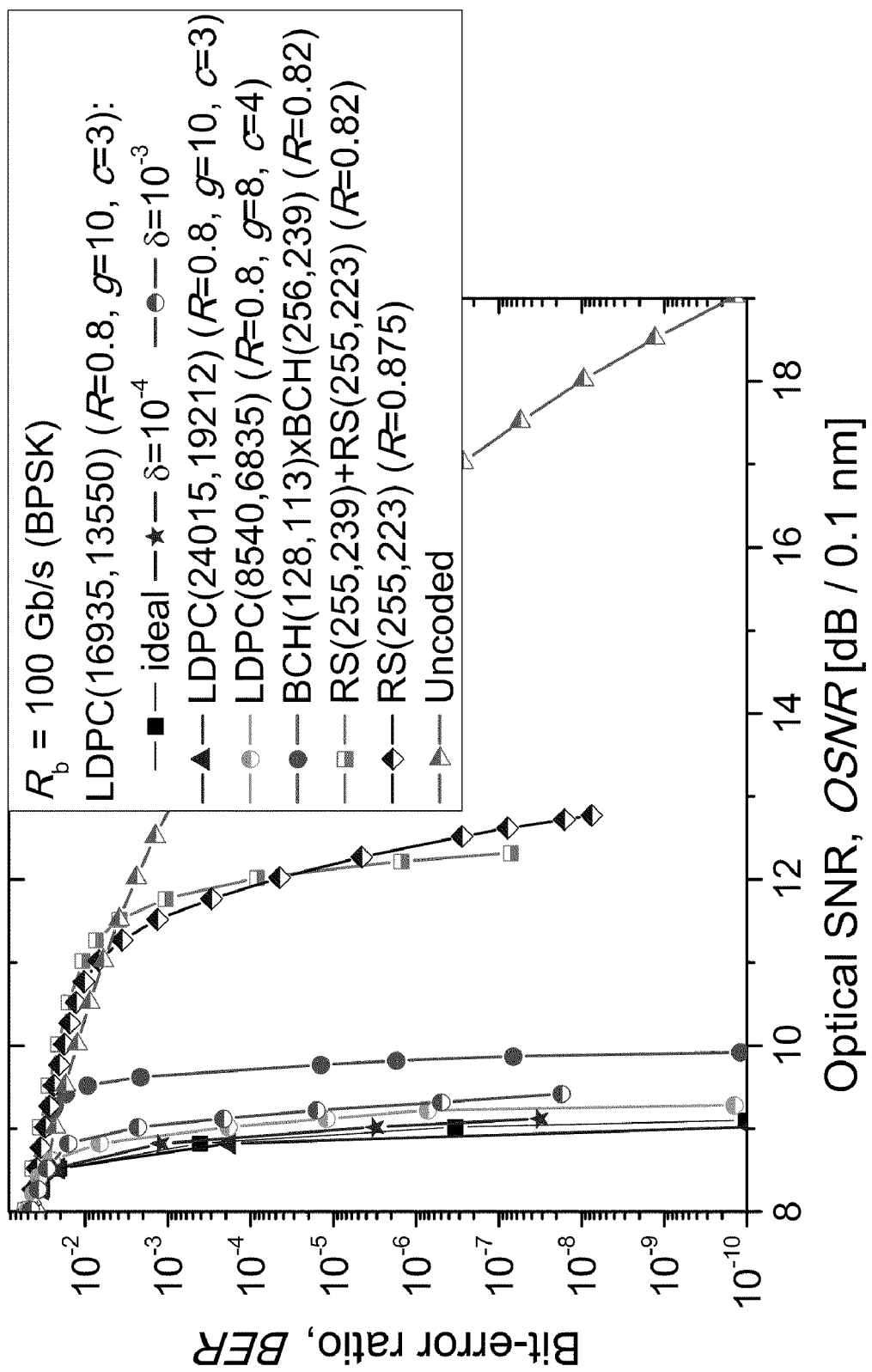
FIG. 4 is a graph showing Bit Error Rate (BER) performance of girth-10 LDPC codes employing the optical LDPC decoder operating at 100 Gb/s for BPSK modulation format.

Simulations performed using our inventive method have been performed and the results of such simulations obtained by observing a linear optical channel model are shown in FIG. 4, where we compare the girth-10 quasi-cyclic LDPC codes (of column weight c=3 and code rate R=0.8 for 30 iterations in decoding algorithm) against RS, concatenated RS, and turbo-product codes. The girth-10 LDPC(24015,19212) code of rate 0.8 outperforms the RS(255,223) (of rate 0.875) by 3.79 dB at BER of $10^{-8}$. At BER of $10^{-10}$ the same LDPC code outperforms the BCH(128,113)×BCH(256,239) TPC of rate 0.82 by 0.91 dB, and provides the net effective coding gain of 10.09 dB.

At this point, while we have discussed and described the invention using some specific examples, those skilled in the art will recognize that our teachings are not so limited. Accordingly, the invention should be only limited by the scope of the claims attached hereto.

The invention claimed is:

1. A low density parity check decoding method which is applicable to arbitrary degree nodes and does not require modification of a bipartite graph, said method comprising the steps of:
   determining bit log-likelihood ratios;
   initialization by performing log domain to probabilistic domain conversion; and
   1) a first half-iteration performed by a first optical circuit comprising a pair of probability multipliers providing an input to a 2×1 coupler;
   2) a second half-iteration performed by a second optical circuit comprising a probability multiplier, an upper output of which is amplified by a first optical amplifier having a gain defined by $1/[P_aP_b+(1-P_a)(1-P_b)]$;
   3) a variable node update performed by a third optical circuit comprising a pair of probability multipliers applied in cascade the output of each one is amplified by an optical amplifier having a gain defined by $1/[P_aP_b+(1-P_a)(1-P_b)]$; and
   4) repeating steps 1-3 above until the estimated code word satisfies a parity check equation or a pre-determined number of iterations has been reached; and determining the code word; wherein the method is applicable to arbitrary check-node and variable-node degrees.

2. The method of claim 1 wherein a parity check node update circuit and a variable node probability update circuit is implemented using a Mach Zehnder delay interferometer.

3. The method of claim 1, wherein the Mach Zehnder Delay Interferometer probability update circuit is includes an input 3 dB coupler, a phase shifter and an output 3 dB coupler.

* * * * *